(12) United States Patent
Gudesen et al.

(10) Patent No.: US 6,432,739 B1
(45) Date of Patent: Aug. 13, 2002

(54) METHOD FOR GENERATING ELECTRICAL CONDUCTING OR SEMICONDUCTING STRUCTURES IN TWO OR THREE DIMENSIONS, A METHOD FOR ERASING THE SAME STRUCTURES AND AN ELECTRIC FIELD GENERATOR/ MODULATOR FOR USE WITH THE METHOD FOR GENERATING

(75) Inventors: Hans Gude Gudesen, Brussels (BE); Per-Erik Nordal, Asker; Geirr I. Leistad, Sandvika, both of (NO)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 09/381,994

(22) PCT Filed: Jan. 28, 1999

(86) PCT No.: PCT/NO99/00022

§ 371 (c)(1),
(2), (4) Date: Sep. 28, 1999

(87) PCT Pub. No.: WO99/44229

PCT Pub. Date: Sep. 2, 1999

(30) Foreign Application Priority Data

Jan. 28, 1998 (NO) ................................................ 980385
Jun. 2, 1998 (NO) ................................................ 982518

(51) Int. Cl.[7] .............................................. H01L 51/40
(52) U.S. Cl. ...................................................... 438/99
(58) Field of Search ........................... 257/40; 365/113, 365/175; 438/99

(56) References Cited

U.S. PATENT DOCUMENTS 4,371,883 A  *  2/1983  Potember et al. .............. 438/99
4,806,995 A  *  2/1989  Day et al. ...................... 257/40
4,825,408 A  *  4/1989  Potember et al. ........... 365/113

(List continued on next page.)

FOREIGN PATENT DOCUMENTS

EP        0344346 A1 * 12/1989
WO       95 09438         4/1995

OTHER PUBLICATIONS

A.R. Brown et al., "Logic Gates Made From Ploymer Transistors and Their use in Ring Oscillators", *Science*, vol. 270, Nov. 10, 1995.
Francis Garnier et al., "All–Polymer Field–Effect Transistor Realized by Printing Techniques", *Science*, vol. 265, Sep. 16, 1994.
D.M. deLeeuw et al., "Polymeric Integrated Circuits and Light–Emitting Diodes", *IEEE*, (1997).
Zy Hua et al., "A New Material for Optical, Electrical and Electronic Thin Film Memories", *Vacuum*, vol. 43, 11:1019–1023, (1992).
Yen–Yi Lin et al., "Pentacene–Based Organic Thin–film Transistors", *IEEE Transactions on Electron Devices*, vol. 44, No. 8, 8/97.

*Primary Examiner*—Michael J. Sherry
*Assistant Examiner*—Asok Kumar Sarkar

(57) ABSTRACT

A method for generating electrically conducting and/or semiconducting structures in three dimensions in a matrix that includes two or more materials in spatially separated material structures is disclosed. An electric field is applied to the separate material structure and the field is modulated spatially according to a protocol. The protocol represents a predetermined pattern of electrically conducting and/or semiconducting structures that are generated in the material structure in response to the field. The matrix composed by the material structures includes structures of this kind in three dimensions. A method for global erasing is also disclosed, wherein an electric field is applied to the matrix until the materials in the matrix, in their entirety, arrive in a non-conducting state in response to the field.

20 Claims, 10 Drawing Sheets

U.S. PATENT DOCUMENTS

Figure 1:
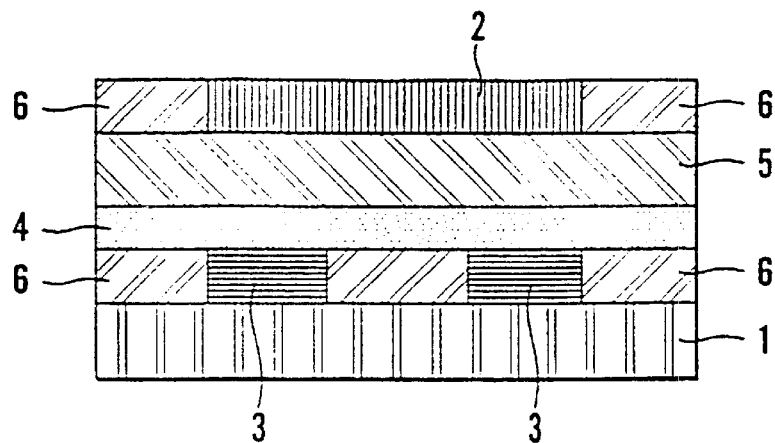

| | | |
|---|---|---|
| 5,043,251 A | 8/1991 | Sonneschein et al. |
| 5,378,916 A | 1/1995 | Mantell |
| 5,537,108 A | 7/1996 | Nathan et al. .......... 340/825.84 |
| 5,572,409 A | 11/1996 | Nathan et al. .............. 361/806 |
| 5,677,041 A | 10/1997 | Smayling |
| 5,686,341 A | 11/1997 | Roesner ....................... 437/60 |
| 5,808,351 A | 9/1998 | Nathan et al. .............. 257/528 |

* cited by examiner

LEGEND TO FIGS.

- ☐ ISOLATING
- ▨ SEMICONDUCTING
- [- - -] p-TYPE SEMICONDUCTING
- [+ + +] n-TYPE SEMICONDUCTING
- ▨ CONDUCTING, ELECTRODES
- ⊤ HORIZONTAL AND VERTICAL CONDUCTING PATH (△, UP; ▽, DOWN)

METHOD FOR GENERATING ELECTRICAL CONDUCTING OR SEMICONDUCTING STRUCTURES IN TWO OR THREE DIMENSIONS, A METHOD FOR ERASING THE SAME STRUCTURES AND AN ELECTRIC FIELD GENERATOR/ MODULATOR FOR USE WITH THE METHOD FOR GENERATING

This application is the national phase under 35 U.S.C. § 371 of PCT International Application No. PCT/NO99/00022 which has an International filing date of Jan. 28, 1999, which designated the United States of America.

The invention concerns a method for generating electrical conducting or semiconducting structures in two or three dimensions in a composite matrix, wherein the matrix comprises none or more materials provided in spatially separate and homogenous material structures, wherein the materials in response to the supply of energy can undergo specific and/or chemical changes of state which cause transition from an electrical non-conducting state to an electrical conducting or semiconducting state or vice versa, or a change in the electrical conduction mode of the material, and wherein each material structure is made in the form of a thin layer. The invention also concerns a method for erasing globally electrical conducting or semiconducting structures generated in two or three dimensions in a composite matrix, wherein the matrix comprises two or more material provided in spatially separate and homogenous material structures, wherein the materials in response to the supply of energy can undergo specific and/or chemical changes of state which cause transition from an electrical non-conducting state to an electrical conducting or semiconducting state or vice versa, or a change in the electrical conduction mode of the material, and wherein each material structure is made in the form of a thin layer. Finally, the invention concerns an electric field generator/modulator (EFGM) for patterning and generating electrical conducting or semiconducting structures in two or three dimensions in a composite matrix, wherein the matrix comprises one or more materials respectively provided in one or more spatially separate and homogenous material structures, wherein the materials in response to the supplied energy can undergo specific and/or chemical changes of state which cause transition from an electrical non-conducting state to an electrical conducting or semiconducting state and vice versa, or a change in the conduction mode of the material, and wherein each material structure is made in the form of a thin layer.

More particularly the present invention concerns the fabrication of two- and three-dimensional isolating, resistive, conducting or semiconducting patterns and structures for use in electronic circuits which most particularly consist of a single or several stacked layers of thin films.

The evolution of microelectronic technology shows a steady trend towards smaller dimensions and reduced costs of the devices. Well-substantiated predictions show that the performance is going to increase, while the price per unit or device will decrease. However, today's microelectronic technology is substantially based on crystalline silicon and shows an increasing tendency towards diminishing returns, mainly due to the inherent limitations associated with the complexity of ultra-high resolution lithography and increasing demands of the material processing. Extrapolations of the present technologies based on crystalline silicon may hence not be expected to offer dramatic breakthroughs in regard of either performance or price and future improvements shall require manufacturing plants and manufacturing equipment which are extremely capital-intensive.

Microelectronics based on thin-film technology may on the other hand confidently be predicted to deliver in the near future products representing real breakthroughs in regard of performance as well as of price. The shift from crystalline inorganic semiconductors to microcrystalline, polycrystalline or amorphous inorganic or organic semiconductors will introduce entirely novel boundary conditions with regard to the production of microelectronics and particularly by the blanks having form factors which make large areas possible, i.e. the substrates may be large sheets instead of wafers cut from blanks of limited size, and great flexibility with regard to architectures, something which will be essential factors in the expected development of tomorrow's electronic technology. In the present invention special emphasis will be placed on the use of organic materials due to the ease whereby they may be processed with basis in the use of large areas and multilayer blanks will precisely controllable thickness, as well as their vast potential for chemical tailoring of the desired material properties.

Particularly before the use of electronics based on amorphous materials can fulfill their expected potential, further developments in certain areas are required. In the recent years an effort has been made to improve the semiconducting properties of organic semiconducting thin-film materials, which have given dramatic and rapid increase in the transistor performance up to a point where organic-based transistors may now compete with transistors based on amorphous silicon (see for instance Y. -Y. Lin, D. J. Gundlach, S. F. Nelson ad T. N. Jackson, "Pentacene-Based Organic Thin Film Transistors", IEEE Transactions on Electron Devices, August 1997). Other on-going projects will lead to coating processes for thin film in order to generate organic and amorphous silicon semiconductors at low temperatures and with compatibility to a broad range of organic and inorganic substrate materials. This has lead to the development of extremely cheap electronic devices with large areas based on the use of high-volume manufacturing methods.

In spite of this development a wholly satisfactory solution to how the fabrication technology shall be adapted and made suitable for a low-cost flexible high-volume production of electrical connections in the thin-film structures forming the electronic circuits is still lacking. Currently thin-film devices are based on amorphous silicon manufactured with current paths and conductors patterned with traditional methods such as lithography and vacuum metallization. The latter method has formerly also been applied to circuits for demonstration of organic-based semiconductor thin-film devices (see for instance A. R. Brown & al. "Logic gates made from polymer transistors and their use of ring oscillators", Science 270:972–974 (1995)). Alternatively, screen printing with conducting "ink" has been used to make transistors on flexible polymer substrates (see for instance F. Garnier & al., "All-polymer field-effect transistor realized by printing techniques", Science 265:1884–1886 (1994)). Even though lithography may provide high resolution, it is relatively complex and includes typically wet chemistry steps which are undesirable in high-volume production of multilayer organic thin-film structures. Screen printing with ink is also far from ideal, as it only provides low to moderate resolution besides being a "wet" method.

As examples of prior art such it is evident from available patent literature may also be mentioned U.S. Pat. No. 5,043,251 (Sonnenschein & al.) which discloses a process for three-dimensional lithography of amorphous polymers for generating a momentary permanent pattern in a polymer material and which comprises steps for providing doped non-crystalline layers or films of a polymer in a stable amorphous state under humane operating conditions. In manufacturing the patterns the film is masked optically and is exposed through the mask to radiation with sufficient intensity to cause ablation of the exposed portions such that a distinct three-dimensional imprint is generated in the film. This process has among other been proposed for use in the manufacture of an optical data storage disk. Further it is from U.S. Pat. No. 5,378,916 (Mantell) known a photo-sensitive device in the form of a single-crystal structure, wherein different portions of the structure may have different compositions. Particular the structure forms a two-dimensional array and a first photosensitive portion comprises a material which generates electron-hole pairs when it is exposed to light within a predetermined first wavelength range, while another photosensitive portion comprises a material which is adapted to generate electron-hole pairs when it is exposed to light within another wavelength range distinctively different from the first wavelength range. Yet further it is from U.S. Pat. No. 5,677,041 (Samyling) known a transistor device which is made by forming a doped layer of radiation-sensitive material on a substrate. The radiation-sensitive material may among others be polyimid, polymer, an organic dielectric, a conductor or a semiconductor. The substrate may be silicon, quarts, gallium arsenide, glass, ceramic, metal or polyamid. A neutral or undoped layer of another radiation sensitive material is formed over the doped layer. First and second source/drain areas are then formed in the neutral layer and extend down to a top portion of the doped layer. A gate area is formed in the top portion of the neutral layer between the first source/drain area and the second source/drain area such that a channel area in the doped layer is provided under the gate area. Drain/source and gate electrodes as formed by irradiation of the uppermost neutral layer through a mask patterned in accordance with the desired electrode pattern and realized such that it intensity-modulates the radiation. In addition the mask may also be realized as a phase-shifting mask.

Finally it is from the article "Polymeric integrated circuits and light-emitting diodes" of D. M. de Leeuw & al., IEDM, pp. 331–336 (1997) known a MISFET wholly realized in polymer and with the use of polymer materials which are given the desired electrical properties by an exposure to UV radiation. In the manufacture photochemical patterning of doped electrical conducting polyaniline films, so-called PANI thin films is used. The films are dissolved in a suitable solution, whereafter a photo-initiator is added to the solution which has been deposited on a suitable substrate such as a polyimide film. By thereafter exposing the PANI film to deep UV radiation through a mask the initially conducting polyaniline is converted in the exposed areas to the non-conducting leucoemeraldine form. The starting point here is accordingly a conducting polymer material, the area resistance of which initially is 1 kiloohm/square, but which after the exposure obtains an area resistance of more than $10^{13}$ ohm/square. In this manner dielectric structures may be generated in an otherwise conducting matrix. FIG. 1 shows a MISFET according to Leeuw & al. comprising a polyimide substrate 1 with a PANI thin film which after exposure to UV light through suitable masks forms isolating structures 6 in the otherwise conducting thin-film material 3. The still conducting areas 3 in the PANI film define respectively the source and drain electrode of a MISFET transistor. Above the PANI film a further layer 4 is deposited in the form of a thin film of polythienylenevinylene or PTV which is an organic semiconductor material. This layer 4 substantially determines the electrical parameters of the MISFET transis-tor. A film 5 of polyvinyl phenol PVP which forms the gate isolator of the transistor and is opaque to UV radiation and visible light is deposited over the PTV film 4. Another PANI film is again deposited on the top of the PTV film 5 and patterned by radiation with UV light such that isolating structures 6 are formed. A still electrical conducting area 2 forms the gate electrode of the MISFET structure.

If several transistors of this kind as mentioned above shall be combined in integrated circuits realized in the form of stacked film layers, vertical current paths between for instance source and drain electrodes in a transistor and the gate electrode in another transistor must be used. Such vertical current paths may in principle be realized mechanically, for instance by depositing a metal film over vertically etched steps in the structure. Otherwise a close analogy is the use of throughplated holes in circuit boards for realizing a vertical connection between current paths on the upper and lower side of the circuit board.

The main object of the present invention is to provide improved fabrication methods for conducting connections and electrodes in microelectronic components and particularly microelectronic devices with large areas on flexible substrates by means of processes which combine high-volume fabrication at low costs. Particularly, it is an object of the invention to provide such fabrication methods that they may be used on layered physical devices, for instance in the form of a large number of adjacent stacked thin-film layers, thus generating three-dimensional circuit structures. The present invention will thereby make possible flexible and cheap, but simultaneously also singularly simple and precise fabrication of devices such as flat display devices, logic circuits, memory devices etc.

Further it is also an object of the invention to provide a method for erasing such three-dimensional circuit structures in situ, such that the material in the structures is converted back to an initial virgin state whereafter it by means of a suitable method may be reconfigured in the form of electrical conducting and semiconducting structures in three dimensions, but for instance with another pattern or another structure than the original.

The above-mentioned features and advantages are realized according to the present invention with a method which is characterized by applying to the separate layer an electric field with given field strength and/or characteristics adapted to the specific response of the material to the energy supplied by the field, modulating in each case the fields spatially according to a determined protocol which represents a predetermined pattern of electrical conducting or semiconducting structures in the relevant material structure, whereby in the layers in response to the energy supplied by the field two-dimensional electrical conducting or semiconducting structures are generated with the pattern predetermined by the protocol, and then optionally providing two or more layers in a stacked configuration, such that the composite matrix formed by separate adjacent layers is provided with electrical conducting or semiconducting structures in three dimensions.

Further it is according to the invention advantageous that the electric field is modulated spatially in a plane substantially parallel with a layer by means of an electrode device with patterned electrodes, the electrode device by selective supply of voltage to the electrodes according to the determined protocol generating electrical point or line potentials, which generate the electrical conducting or semiconducting structures.

It is according to invention advantageous that the stacked configuration is formed by two or more layers after generating the electrical conducting or semiconducting structure in each layer being combined into laminated multilayer structures which forms the composite matrix with electrical conducting or semiconducting structures in three dimensions.

It is according to the invention also advantageous positioning the multilayer formed by a lamination of two or more self-supporting layers into a stacked configuration. A layer is after the lamination to adjacent layers then preferably positioned such that two or more two-dimensional electrical conducting or semiconducting structures in the first-mentioned layer according to the protocol register with one or more two-dimensional electrical conducting or semiconducting structures in adjacent layers, whereby one or more vertical electrical conducting or semiconducting channels are generated in the cross-direction through the layers.

Finally, it is according to the invention advantageous providing an electrical conducting or semiconducting structure which forms a vertical channel through the layer according to the protocol, in electrical conducting or semiconducting connection with one or more two-dimensional electrical conducting or semiconducting structures in this layer, each channel preferably being generated with a conductivity or conduction mode which is constant between the layers or with a conductivity or conduction mode which varies between the layers.

A method for global erasing according to the invention is characterized by applying globally to the composite matrix an electric field with given field strength and/or characteristics adapted to the specific response of the material to the energy supplied by the field until the materials in the composite matrix in response to the energy supplied by the field in their entirety arrive in the electrical or non-conducting state.

An electric field generator/modulator is according to the invention characterized in that it comprises a first electrode means with a plurality of parallel strip electrodes provided in a plane, a second electrode means with a plurality of parallel strip electrodes provided at a distance from the first electrode means and superpositioned thereto in a second plane parallel with the first plane such that the electrodes mutually are substantially orthogonally oriented in a matrix-like arrangement, that the electrode means over cross-connection devices are connected with a controllable power supply, the electrical field generator/modulator in the space between the electrode means being adapted for receiving a thin-film material in the form of a discrete component or a continuous tape which without touching the electrode means continuously or intermittently is fed through the space with simultaneous positioning and alignment spaced apart from and between the electrode means in a plane substantially parallel thereto, whereby the electrical conducting or semiconducting structures can be generated according to a determined protocol and by means of point, line or area potentials is created between selected electrodes in the electrode means when the former over the cross-connection devices are supplied with electric power. Preferably are the electrodes in each electrode means provided on or in surfaces of respective substrates facing each other and/or in that connection preferably made as a part of the substrates and form conducting structures in the substrate material.

Further it is according to the invention advantageous that the distance between the electrode means is controllable depending on the thickness of the thin-film material.

Finally it is according to the invention advantageous that the electrodes in each electrode means are provided with a mutual distance between 0.1 $\mu$m and 1.0 $\mu$m and that the electrodes in each electrode means are formed with substantially constant width of 0.1 $\mu$m to 1.0 $\mu$m.

Figure 4:
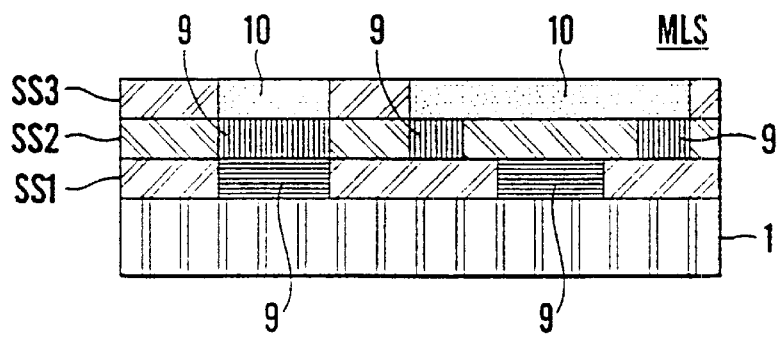
Figure 5:
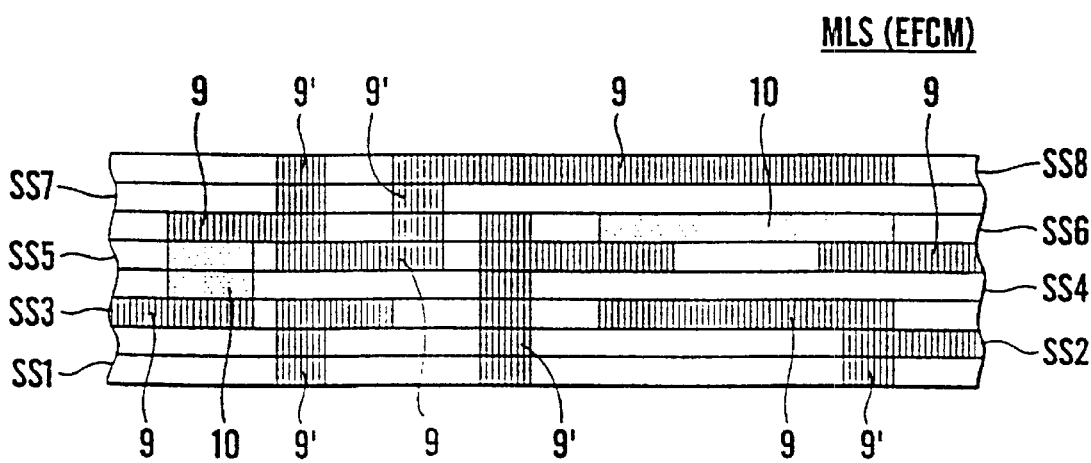
Figure 2A:
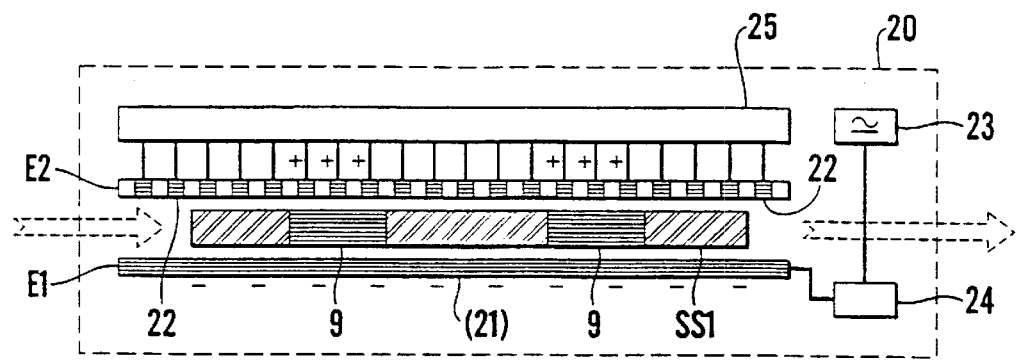
Figure 2B:
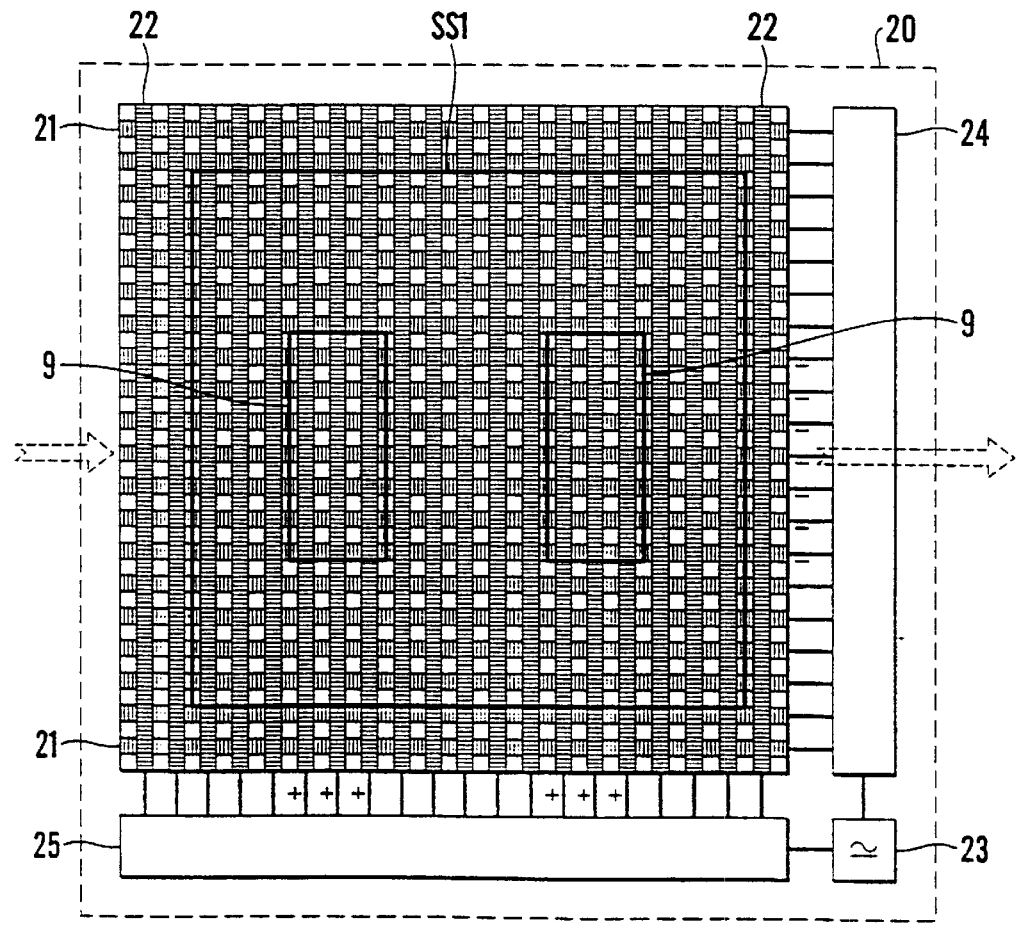
Figure 2C:
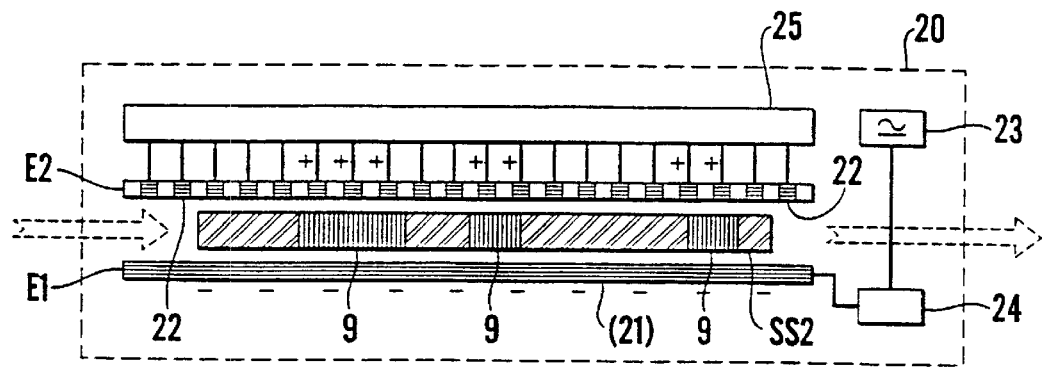
Figure 2D:
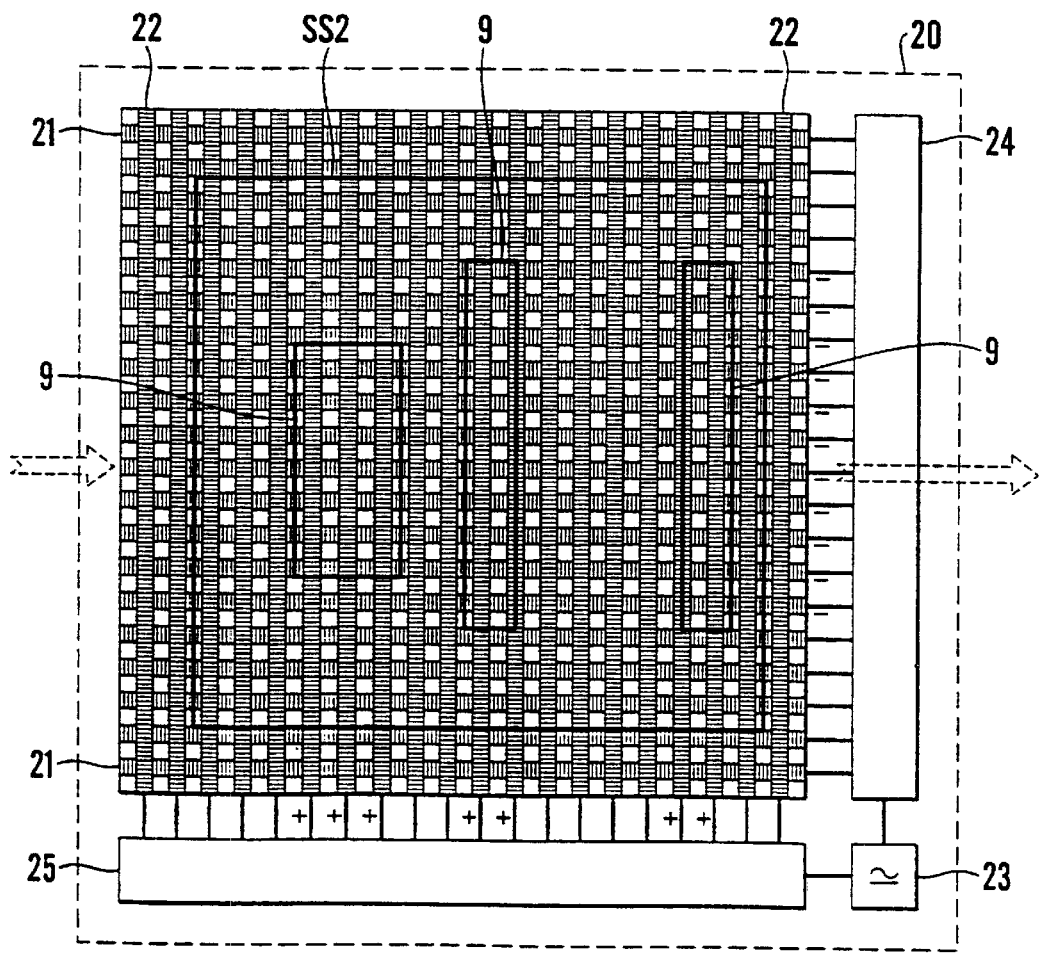
Figure 2E:
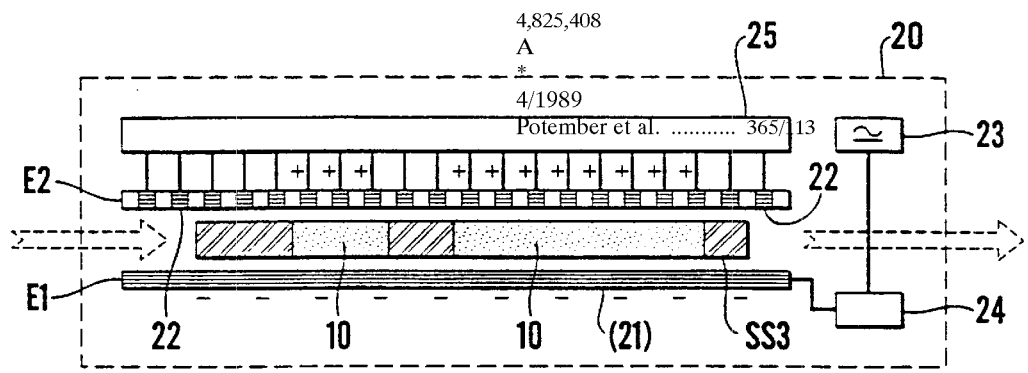
Figure 2F:
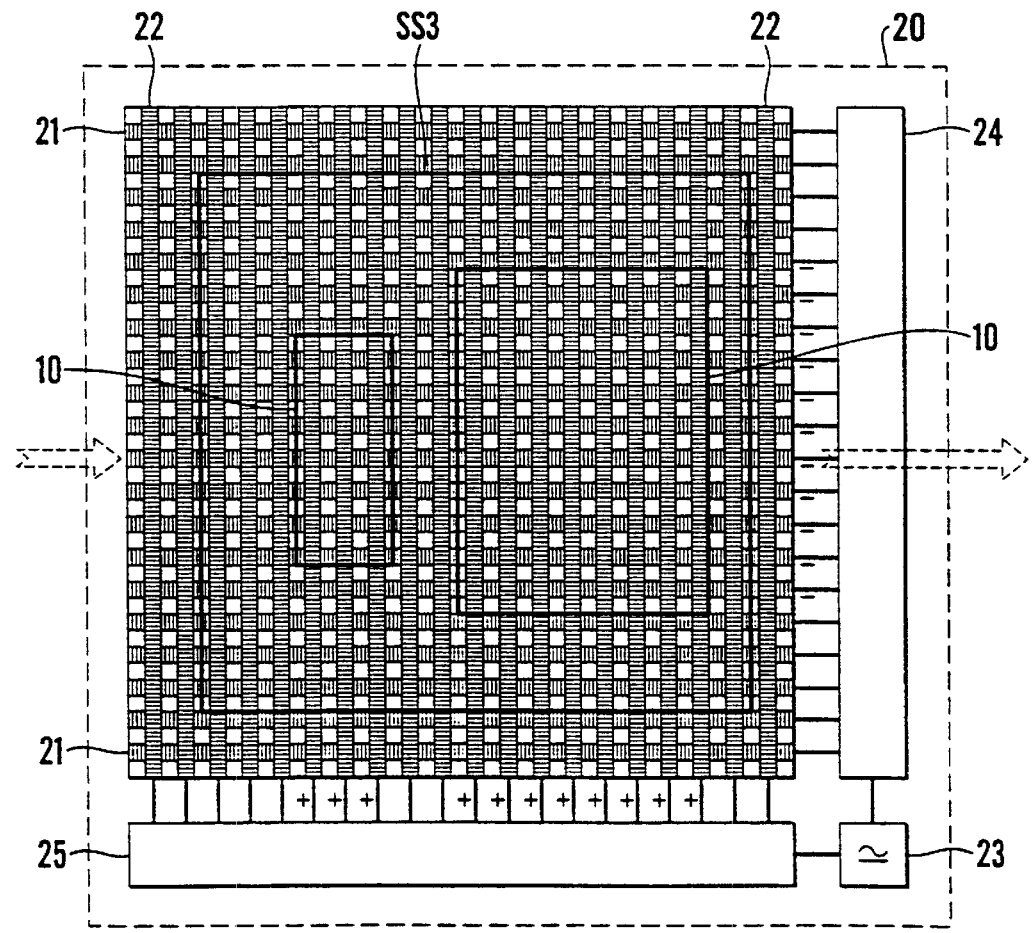
Figure 3:
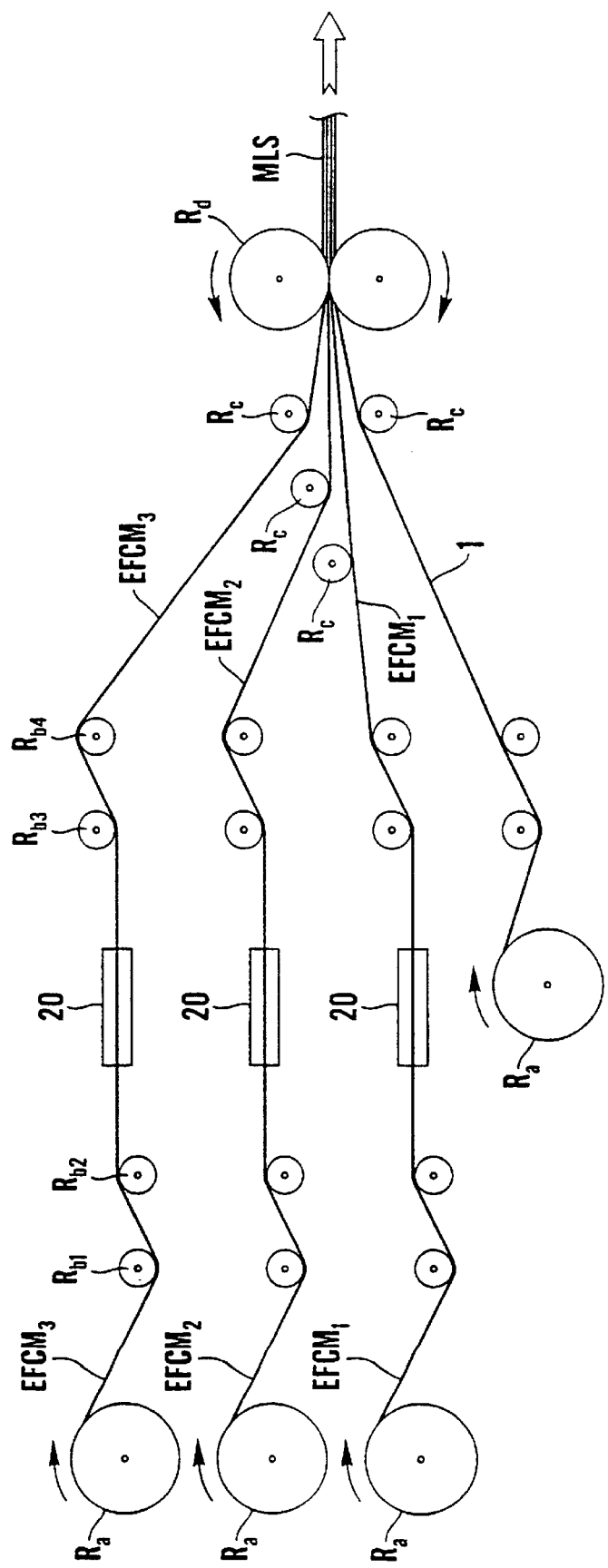
Figure 6:
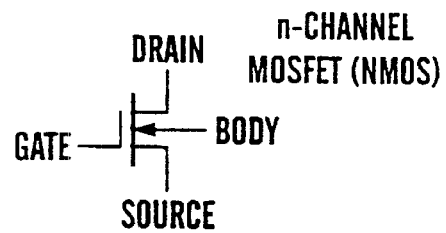
Figure 6:
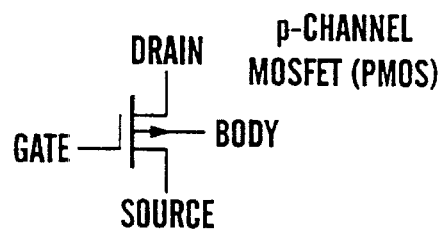
Figure 6:
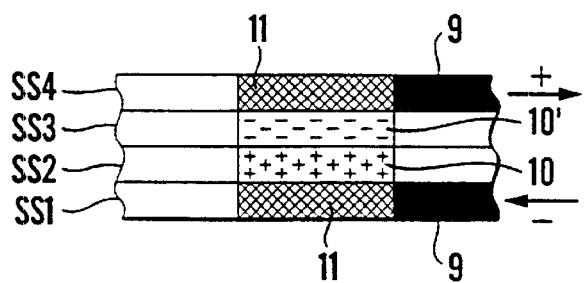
Figure 7:
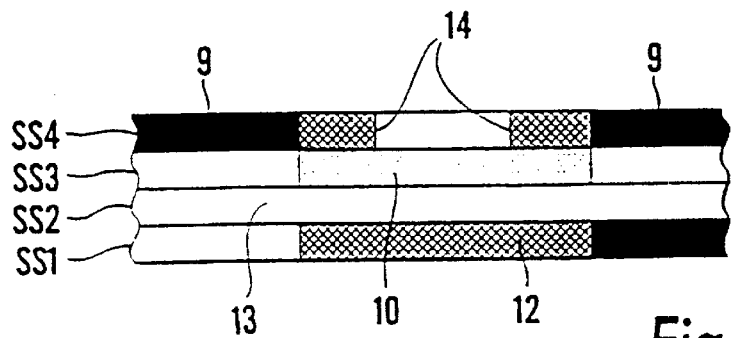
Figure 9:
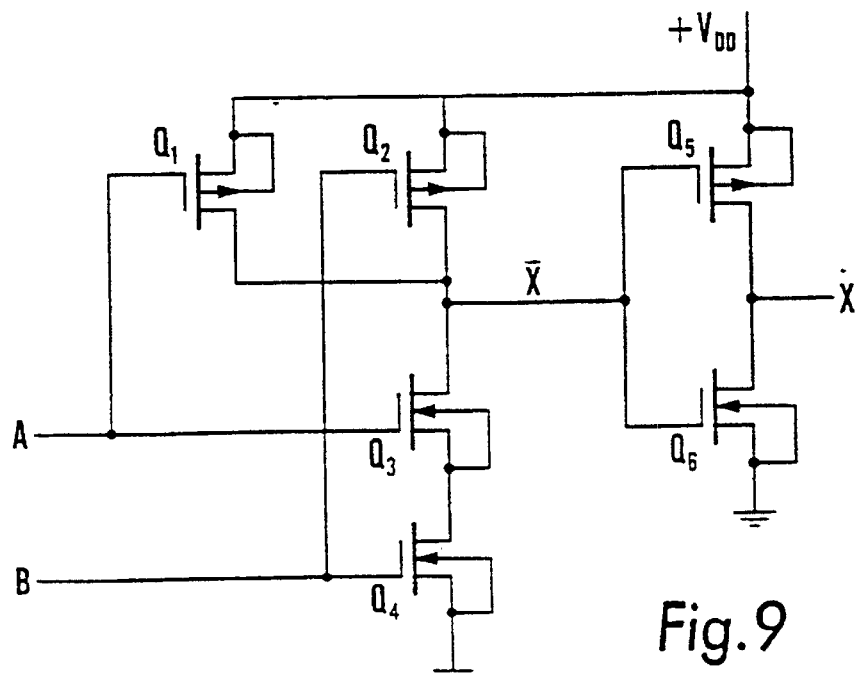
Figure 10A:
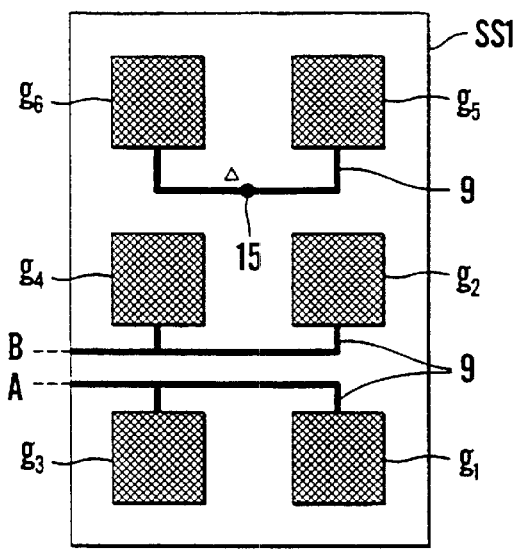
Figure 10B:
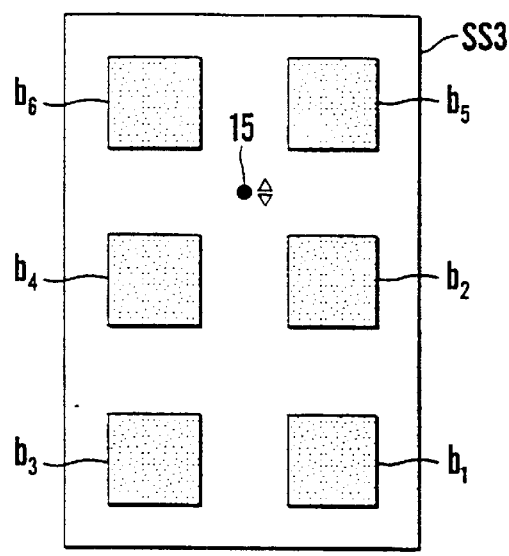
Figure 10C:
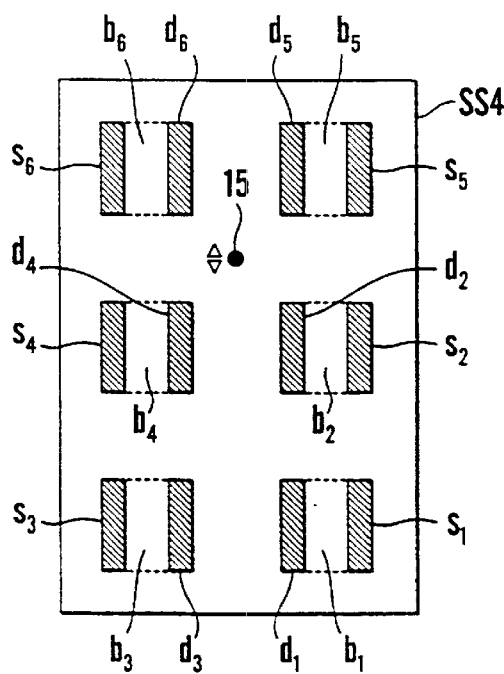
Figure 10D:
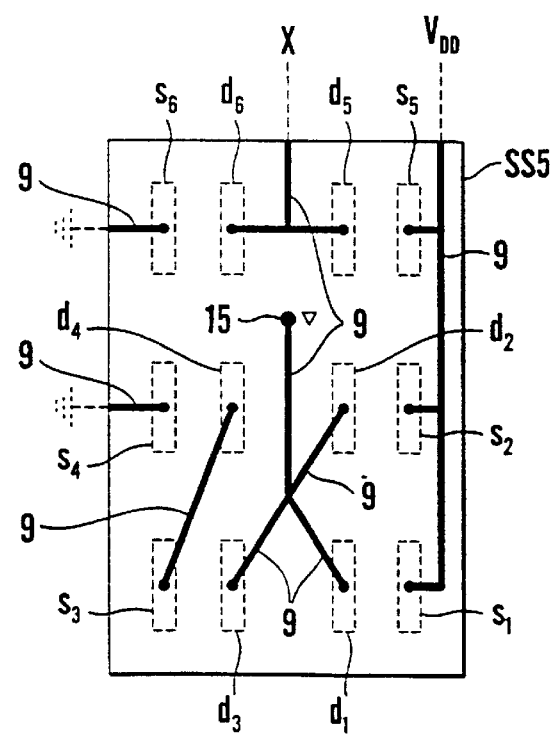
Figure 11:
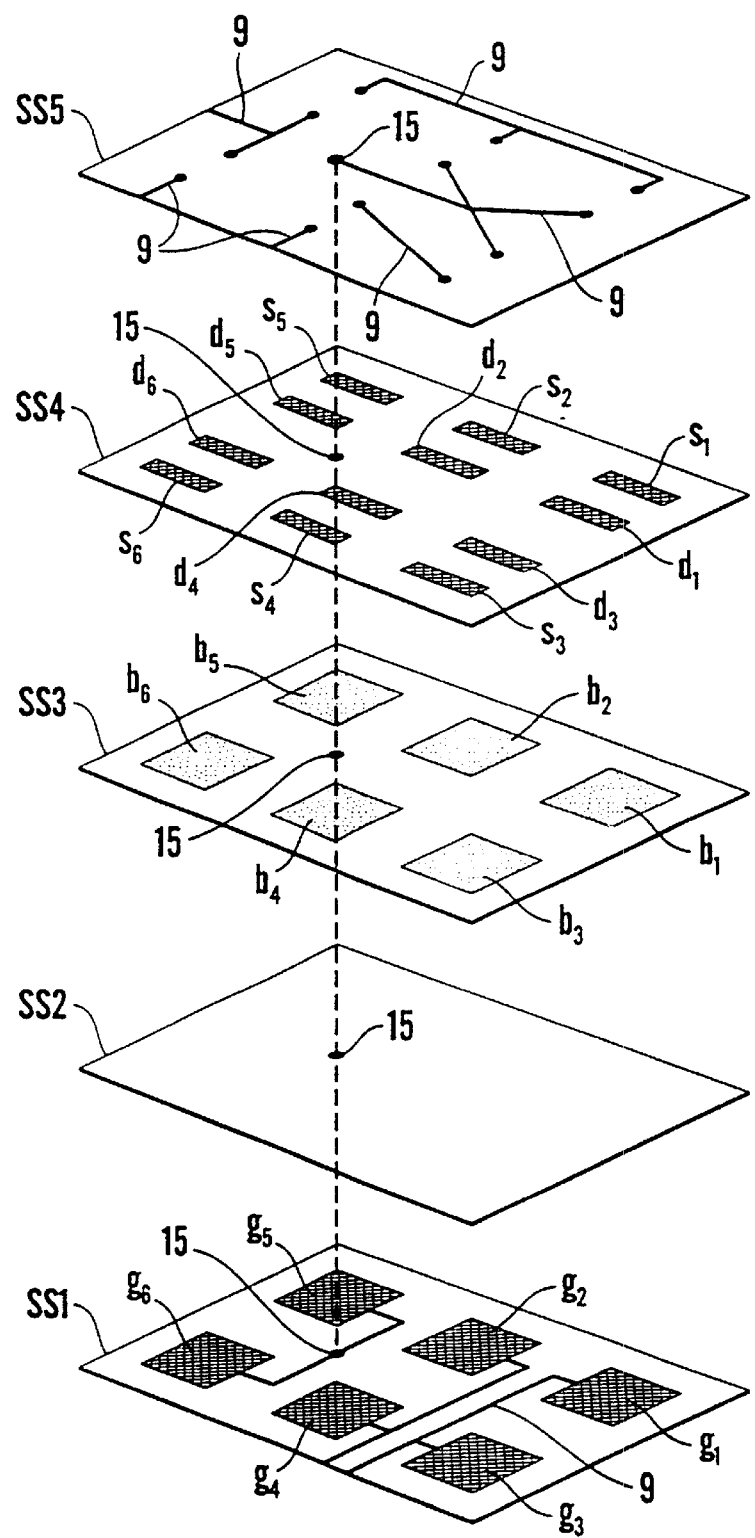
Figure 12:
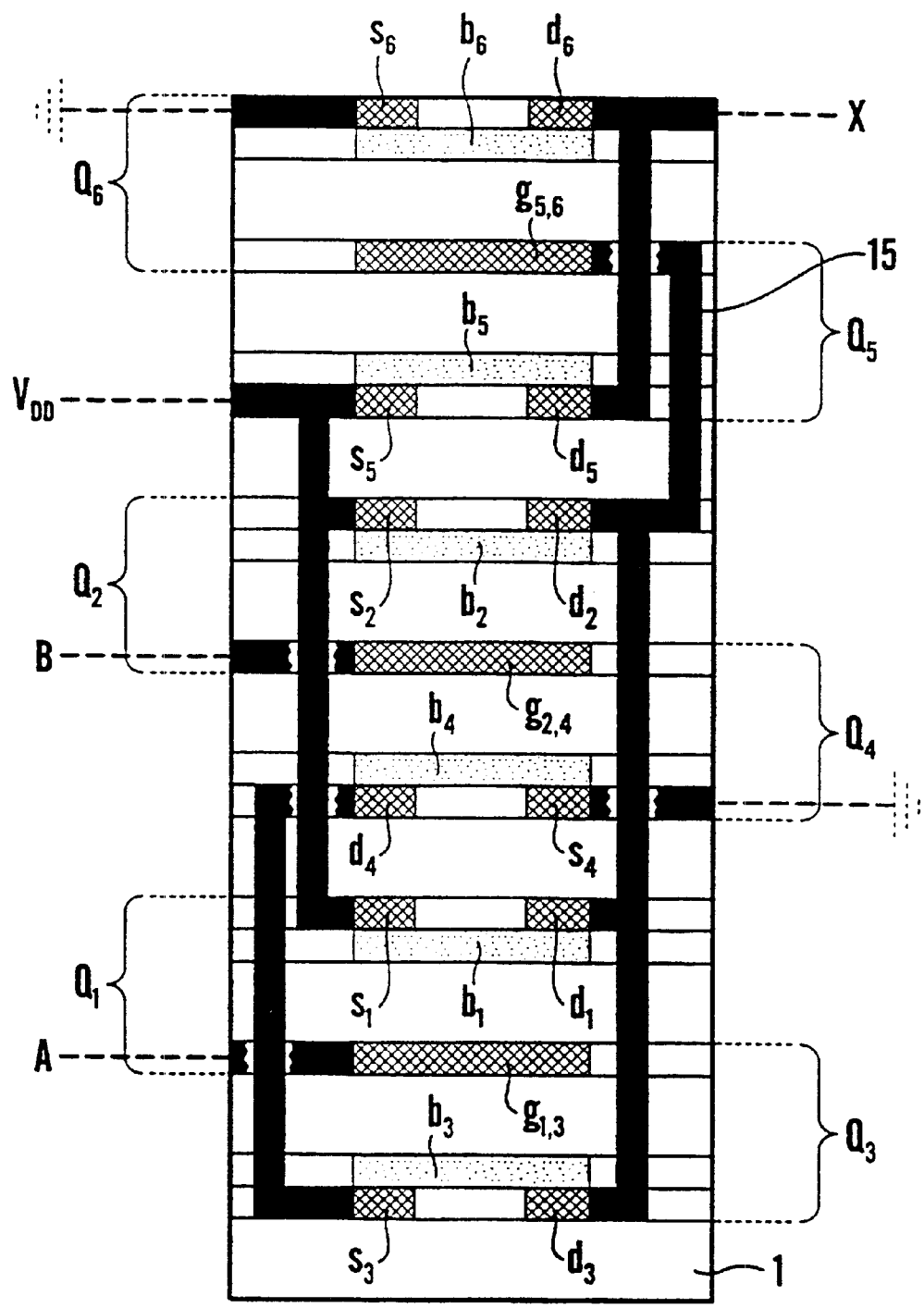

The invention shall now be explained in more detail in connection with a survey of its basic principles an with the use of exemplary embodiments in connection with the appended drawings, wherein FIG. 1 shows a MISFET with the electrodes formed of photoconvertible material according to the prior art, FIGS. 2a, b schematically respectively in section and plan view an embodiment of the electric field generator/modulator (EFGM) according to the invention and its use in a first step in the method for generating according to the invention, FIGS. 2c, d schematically in respectively section and plan view EFGM as shown in FIGS. 2a, b and used in a second step in the method for generating according to the invention, FIGS. 2e, f schematically in respectively section and plan view EFGM as shown in FIGS. 2a, b and used in a third step in the method for generating according to the invention, FIG. 3 schematically the embodiment of the method for generating according to the invention, combined with a lamination of single layers into a multilayer structure, FIG. 4 a section through a multilayer structure with conducting and semiconducting structures as generated by the steps shown in FIGS. 2a–f, FIG. 5 a schematic section through a laminated multilayer structure which comprises conducting or semiconducting structures generated by the method according to the present invention, FIG. 6 a schematic section through a diode structure generated by the method according to the present invention, FIG. 7 a schematic section through a MOSFET structure generated by the method according to the present invention, FIG. 8 a schematic section through a logic inverter structure based on the MOSFET structure in FIG. 7 and generated by the method according to the present invention, FIG. 9 the equivalent diagram of an AND gate realized in CMOS technology, FIGS. 10a–d in plan view sublayers in an AND gate structure generated by the method according to the invention and according to the equivalent diagram in FIG. 8 with the use of MOSFET structures as shown in FIG. 7, FIG. 11 the AND gate structure in FIG. 10 as a stacked multilayer configuration, but exploded in the separate sublayers, FIG. 12 schematically another variant of the AND gate structure in FIG. 10 and with the separate MOSFET structures provided mutually connected in a vertical configuration.

Now the basic principles of a method according to the present invention whereby three-dimensional structures with a well-defined mode and degree of electrical conduction are generated by spatially controlled patterning in situ in convertible materials (CM) which have such properties that their electronic properties are converted reversibly or irreversibly under the effect of radiation, heat, or electric fields. The method for generating such structures according to the present invention is based on the use of electric fields, either direct current fields or alternating current fields. Initially the three-dimensional electrical conducting or semiconducting structures can be generated as two-dimensional structures of this kind by direct local influence of the electric field on a single layer and appears as three-dimensional by joining single layers into a multilayer structure. Typically an electric field-convertible material (EFCM) will be an organic material, for instance a molecule, an oligomer or a polymer where a phase transition from an initial first state to a new second state takes place upon being subjected to an electric field, for instance of a given field strength or with a given frequency. As mentioned in the following, it is presupposed that the most important change taking place from the first to the second sate, is the degree of electrical conduction. In the following the method for generating and erasing of electrical conducting or semiconducting structures by means of electric fields shall be discussed both generally and more specifically in connection with a description of the figures.

For polymers such as polyaniline there are as shown in the above-mentioned paper by de Leeuw & al., observed conduction ratios between two states as high as $10^{10}$. In this case it concerned in situ conversion of a single layer of irradiation convertible material from conducting to non-conducting state in order to generate electrical connections in a single electronic circuit. Electrical conducting connections in doped polyaniline films (PANI films) were defined by exposure to deep UV radiation through a patterned mask.

A multilayer stack of different electric field-convertible materials may be provided on a substrate which may be flexible or rigid, conducting or non-conducting. The field-convertible material are made conducting, semi-conducting or isolating in desired patterns by subjecting a number of single layer field-convertible materials to spatially-controlled electric fields, and with subsequent combination of the layers into a multilayer stack. Multilayer stacks of field-convertible material are of particular interest in connection with multilayer thin-film circuits where it is required to generate electrical conducting lines, current paths, connection points or electrodes in several layers such that the conducting structure sin one layer has a precisely controlled spatial relationship to the conducting structures in the layers which are located above or below. One example is thin-film field effect transistors (TFET) where the source and drain electrode in a layer must be correctly positioned relative to the gate electrode and with intervening isolating and semi-conducting layers. Another example is electrical connections between the layers where traditional solutions in many cases are unsatisfactory, for instance by incorporating a number of steps such as forming open channels or vias between suitable points which then shall be electrically connected in the different layers and with subsequent filling or casing of the channels with a conducting material, such as this finds its parallel in the use of through-plated holes in circuit boards to obtain a connection from the front to the back of the circuit board. A third instance is the generation of capacitors by defining conducting areas which are aligned mutually opposite in two layers separated by an isolating layer. Evidently not only highly conducting, but also isolating resistive and semiconducting patterns in multilayer structures are of the greatest importance. Such as will be explained in more detail in the following, patterns of this kind may be generated by using the method for generating electrical conducting or semiconducting structures or patterns according to the present invention. With regard to the precision and clarity the following description shall, however, be introduced by emphasizing on how patterns and three-dimensional structures which either are very good or very bad electrical conductors shall be defined.

Multilayer structures as described herein are of particular interest when they are integrated with thin-film semiconductors in order to from complete circuits. The present standard procedures for fabricating microelectronic circuits which exploit the semiconducting properties of a common silicon substrate restrict automatically the realizable architectures to the kind which allows access to the substrate for all active devices. If the method according to the present invention is used for generating electrical conducting or semiconducting structures in three dimensions by means of converted single stacked single layers, whole devices may be generated in this manner without any essential restriction with regard to the size or complexity as scaling quite simply takes place by joining more layers to the stack. As each layer may be made thin, for instance with an order of magnitude of 10–100 nm, the resulting volumetric density for the circuit patterns and hence the performance per weight or volume unit may be extremely high. Further hybrid architectures may be realized with the use of layers which includes electrical field-converted electronic structures which are formed on the top of and function in cooperation with traditional silicon-based electronic circuits.

The basic object of the present invention is the generation of electrical conducting, semiconducting or resistive structures in three dimensions within a multilayer material in monolithic format, as the structures mentioned are generated with the use of electric fields in the form of point, line or area potentials. An embodiment of the method for generating with the use of electric field shall now be described with reference to FIGS. 2a–f.

FIG. 2a shows a section through an electric field generator/modulator according to the invention which functions as an electric patterning device for electric field-convertible materials. The electric field generator/modulator is realized such that it both generates the field and in addition also can modulate the fields spatially, i.e. in a plane or two-dimensions and generate electrical conducting or semi-conducting structures with the desired pattern in this plane. In the following will hence the electric field generator/modulator abbreviated be denoted EFGM. EFGM 20 comprises as shown in FIG. 2a in section and in FIG. 2b in plan view a first electrode means E1, consisting of thin parallel electrodes 21 and another electrode means E2 provided spaced apart from the electrode means E1 in a plane parallel thereto. The electrode means E2 consists similarly of thin parallel electrodes 22 provided such that they are oriented substantially orthogonal to the electrodes 21 in the electrode means E1. The electrode means E1, E2 are connected with a power supply 23, here shown as a direct voltage supply, but the power supply 23 may also be an alternating voltage supply. The power supply 23 is connected with the electrode 21; 22 in the electrode means E1;E2 over respective cross-connecting devices 21, 24. The distance between the electrode means E1, E2 allows a thin film of electrical field-convertible material EFCM in FIG. 2a denoted SS1 to be inserted between the electrode means E1, E2, without contacting these. The electrode means E1, E2 may be formed of self-supporting or supported thin films wherein the electrodes 21, 22 in each case are embedded in the film material. Similarly it is to be understood that the layer SS1 of the field-convertible material EFCM may be a continuous tape which is inserted in EFGM 20 between the electrode means E1, E2 in a substantially continuous movement. By applying voltage e.g. to an electrode 21 in the electrode means E1 and to an electrode 22 in the electrode means E2 an electric field perpendicular to the layer SS1 is formed in the intersection between the electrodes 21 and 22 and the field-convertible material SS1 will be able to transfer from a non-conducting to a conducting state in areas which is influenced by the field between the electrodes 21, 22. If an electrode 21 and another electrode 22 respectively are addressed electrically in this manner, an approximate point potential is obtained in the intersection between. If e.g. an electrode 21 in the electrode device E1 and all electrodes 22 in the electrode device E2 are addressed, a field is obtained substantially in the form of a line potential along the electrode 21 in question and correspondingly a line-like, for instance an electrical conducting structure in the layer SS1 which is located between the electrode device E1, E2 will be generated. If an number of electrodes 21 which are located juxtaposed to each other in the electrode device E1 and correspondingly a plurality of electrodes 22 which are juxtaposed to each other in the electrode device E2, the field which are created between the electrode intersections will generate an area potential and it may for instance be generated an electric area structure in the layer SS1. In FIGS. 2a, 2b such electrical conducting structures are e.g. generated substantially as area structures, but it is to be understood that there also may be generated as point of line structures, dependent on the manner whereby the electric field is generated.

FIGS. 2c and 2d show respectively in section and plan view how EFGM 20 is used for generating for instance electrical conducting structures 9 in a second layer by addressing the electrode means E1, E2 in EFGM 20 in a suitable manner. Correspondingly FIGS. 2e,f also shows in section and plan view EFGM 20 with a third layer SS3 which here for instance is patterned with semiconducting structures 10. As shown in FIGS. 2a–f the patterning of the field-convertible material EFCM takes place for each separate layer SS1, SS2, SS3, but these layers may as mentioned above, be present in the form of self-supporting single films of EFCM and assembled into a multilayer stack, such this schematically is shown in FIG. 3. The fabrication of circuits realized with electrical conducting and semiconducting structures in EFCM can take place with tapes of EFCM in continuous paths as shown. Each tape or each film are in FIG. 3 shown as three films EFCM1, EFCM2, EFCM3 and are converted by electric field to the desired spatial pattern in separate EFGM 20 for each of the paths. Then follows the assembly into a multilayer structure MLS, e.g. by gluing or heat-assisted lamination. The multilayer structure MLS may well be provided on a substrate which, of course, is not subjected to any electric field, but is laminated to the multilayer structure MLS in the same process step. In each case a flexible tape MLS is obtained which either may be folded or coiled or cut into segments, for instance to make single circuits. In FIG. 3 the field-convertible material EFCM in the form of three tapes or films EFCM1, EFCM2, EFCM3 is drawn from respective rolls $R_s$ and conveyed in separate lines by alignment rolls $R_{b1}$, $R_{b2}$, $R_{b3}$, $R_{b4}$ in each line for tensioning and positioning of the tapes through EFGM 20. The completed patterned films EFCM1, EFCM2, EFCM3 are conveyed over a guide roll set $R_c$ and possibly after a further position adjustment through a lamination step $R_d$ and laminated into the multilayer structure MLS. This multilayer structure may as mentioned, include a substrate 1 which is drawn from a further roll $R_a$ in a separate line and its laminated together with the converted film material EFCM in the lamination step $R_d$. For three layers which are laminated together in this manner and converted as shown in FIGS. 2a–f, it may then as shown schematically in section in FIG. 4 be obtained a circuit structure which is provided on the substrate 1. The conducting structures 9 and the semiconducting structures 10 contact each other vertically or extend horizontally in each of the layers SS1, SS2, SS3 as shown and form together three-dimensional structures of this kind in the desired pattern.

The electrode means E1, E2 in the electric field generator/modulator (EFGM 20) as for instance shown in FIG. 2a and FIG. 2b, may be formed in or on substrates of a non-conducting material and the electrodes 21, 22 may then be provided on the opposite surfaces of the substrates or embedded in the substrates. They may also form conducting structures in the substrate material itself. The electrode width and the mutual distance between the electrodes 21, 22 in each electrode means E1, E2 will be determining for the spatial resolution in the patterning of the conducting or semiconducting structures and the achievable pitches. In compatibility with today's semiconductor technology the electrodes 21, 22 thus be realized with a width between 0.1 and 1.0 μm and corresponding mutual distances. It is with present technology wholly possibly to realize electrode widths, e.g. in thin films provided on substrates, of 0.1 μm or less by nanotechnology, for instance printing methods, or by means of chemical methods. The circuit patterns which are realized with EFGM 20 with the method according to the present invention will at least be dimensionally compatible with that which optimally may be achieved by using for instance microlithography in silicon-based circuit technology. Dependent on the thickness of thin film material wherein conducting or semiconducting structures, i.e. circuit patterns, shall be generated, the distance between the electrode devices E1, E2 can be controlled in order to achieve an optimum definition of the potentials formed between the electrodes. The control may take place via not shown micromechanical servocontrol means which are well-known to persons skilled in the art. —During the generation of the circuit pattern the space between the electrodes may besides be filled with an isolating gas with high dielectric strength in order to prevent break-down between the electrodes.

The power supply 23 in EFGM 20, e.g. as shown in FIGS. 2a and 2b, may either be a direct current source or an alternating current source. Preferably it will be realized as a controlled power supply and be able to supply the electrode means E1, E2 with current with different modes and characteristics. For this purpose both the power supply 23 and the cross-connection means 24, 25 hence will be connected with a not shown external control device which may be programmed according to the protocol for a desired circuit pattern and corresponding control the generation of the desired electrical conducting or semiconducting structures in the layer material or the thin film material between the electrode means E1, E2. Protocols and required software may be loaded to the not shown control device from any external source and it is hence nothing against that the fabrication of circuits with the use of EFGM 20 may be managed from a distal locality.

There shall now be given a more detailed discussion of the electric field-convertible materials EFCM which may be used in the method according to the present invention, as well as specific techniques which may be used in the embodiment of said method. The basic principle of in situ field-conversion of materials is to generate conducting or semiconducting structures by means of spatially modulated and/or field strength modulated electric fields. The conversion itself may additionally be reversible or irreversible. Concrete examples of this will be given below. It must be mentioned that EFCMs at the time being are in an early development stage and it is to be expected that ongoing research and development activities in the field dramatically shall increase the number of available materials.

It is in the present invention particularly preferred used EFCMs which by being subjected to an electric field remain in this state until they again are subjected to which brings the material back to the initial state. This is among other the case of different organic macromolecules and other materials which generally are known as molecular electronic materials. An instance of a material of this kind is disclosed in the paper "A new material for optical, electrical and electronic thin film memories" by Z. Y. Hua & G. R. Chen, Vacuum, Vol. 43, No. 11: 1019–1023 (1992). This material is an organometallic charge-transfer complex M(TCNQ) formed by TCNQ (7,7,8,8-tetracyanoquinodimetan, $C_{12}H_4N_4$) which functions as an electron acceptor molecule with different metals as electron-rich donors. The metals may be Li, Na, K, Ag, Cu or Fe. M(TCNQ) may under the application of electric fields and for the sake of that also energy supplied in the form of heat or light radiation transfer from a high impedance state to a low impedance state. Generally the reaction can be written as

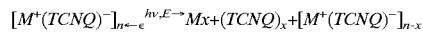

The process is reversible, as the return reaction may be obtained by supplying energy ϵ in the form of heat, electrical fields or photon radiation. The reversible reaction results in that M(TCNQ) may be used for generating a bistable switching medium, for instance an erasable memory material. In the method according to the present invention only electric fields are used and not irradiation. In thin layers, for instance of 100–200 nm, M(TCNQ) has non-linear current-voltage characteristics, something which maybe used for realizing memories of the type ROM and RAM. For this purpose it is of particular interest that M(TCNQ) stably and reproducably allows current-controlled bistable electrical switching. In an electrical addressable memory for instance the high impedance state may be used for representing binary 1 and the low impedance state binary 0. The transition time between two such states is less than 400 ns. —Further examples of relevant materials are discussed in W. Xu & al., "Two new all-organic complexes with electrical bistable states", Appl. Phys. Lett. 67:2241–2242 (1995) and the therein appended literature references. The materials mentioned are bistable and have well-defined thresholds for conversion from conducting to non-conducting state and vice versa with the use of electric fields.

In certain field-convertible materials, including TCNQ, the conversion from a non-conducting to a conducting state may also take place when the energy is supplied in the form of the heat. As the field-convertible material basically is dielectric or strongly resistive, an electric alternating field which over the electrodes is applied with a suitable frequency to the material, may induce heat in the potential area and a heating with a subsequent conversion of the material from a non-conducting to a conducting state in this area may then take place. The power supply must then be operated as an alternating power supply and the thermal conversion must be regarded as a secondary effect induced by the electric field. In order to obtain good spatial definition of the generated electrical conducting or semiconducting structures the thermal field which is induced by the alternating field in the material must be precisely controlled. The thermal field will namely propagate through the material and cause a temperature increase which may influence the electrical properties of the material outside the potential area which ideally shall define the spatial extent of the generated structure. If the field-convertible material is regarded s an infinite thin layer, the temperature increase will make itself felt unto a distance from for instance a point potential which falls together with the intersection point of the activated electrodes, with a thermal diffusion length defined by the formula $$\mu = (\kappa/\pi f \rho c)^{1/2} \qquad (1)$$

where the material parameters

κ=thermal conductivity, f=1/τ the characteristic frequency which is ≈ the inverse of the pulse duration τ, ρ=the density of the material, and c=the specific heat of the material.

It follows from equation 1 that in order to reduce the thermal diffusion and obtain a sharp spatial definition of the desired electrical conducting or semiconductor structures, an alternating current pulse should be used which provides high field strength and a fast temperature increase in the potential area with subsequent rapid conversion of the field-convertible material. This may be achieved by combining a high field strength with high field frequency and with the use of field-convertible materials in the form of thin films with a thickness of 100 nm it is supposed that an unwanted thermal diffusion effectively can be avoided by using alternating current pulses of at most a few microseconds. In this connection the field characteristics must also be tuned to the desired degree of conductivity on the potential areas which ideally defines the generated conducting and semiconducting structures.

Electrical connections between different layers in thin-film materials or other types of electronic materials present a major challenge for the fabrication of microelectronics. Precise positioning of conducting paths in each layer plane and in the perpendicular direction to the planes is of paramount importance and comprises typically forming vias or holes which may be filled with conducting material in order to create connections perpendicular to the layers. The physical manufacture of the holes in prior art takes place by means of drilling, punching or etching, and the conducting material is added by mechanical filling, electroplating etc. Very clearly processes of this kind represent a significant complication and a substantial cost with an accompanying limited precision.

In the present invention the connections as well as active and passive devices may be generated in the same processing sequence which defines the electrical conducting and semiconducting structures in each layer, i.e., with the same kind of spatial precision as the structures themselves and without resorting to further and other types of manufacturing steps. FIG. 5 shows the basic principle for the particular case where a single conducting path 9 shall be generated between a portion of for instance of a conducting structure in a layer SS5 and a portion of another conducting structure 9 in a layer SS8 spaced apart from the former. By repeated conversion of a small area in the same location of in each of several adjacent layers between the termination points of a conducting or semiconducting structure, a column 9' of conducting material is formed as shown in FIG. 5 and electrical conductivity obtained stepwise from the starting layer SS5 which contains the first conducting structure, to the final layer SS8 which contains the second conducting structure. The cross-section of column 9' may be defined arbitrarily via the selected electric field pattern. A number of parallel conducting columns may be generated by direct extension of this procedure and the columns may begin and end in different layers such this is apparent from FIG. 5. In a given layer which contributes with a conducting structure 9 in connection with one or more conducting columns of vertical conducting structures 9', the latter shall be made concurrently with other conducting 9 or semiconducting structures 10 which are patterned in this layer, for instance SS6 in FIG. 5, i.e. without having to carry out other or different processing steps. Typically the degree of conversion from a non-conducting to a conducting state or vice versa can be controlled by the field strength and/or its time characteristics, possibly also by the duration of the field. Thus a column which connects points in two different layers may be formed such that it functions as a resistor in a circuit by choosing the degree of conductivity in segments from layer to layer along the column.

A method for erasing electrical conducting or semiconducting structures generated in three dimensions forms a part of the invention.

In principle may electrical conducting or semiconducting structures in single layers be erased selectively with the use of EFGM20 as shown in any of the FIGS. 2a–f ad suitable spectral modulation. After joining of single layers into a multilayer structure MLS the erasing at time being can, however, only be performed globally by the multilayer structure, in case the matrix, globally is subjected to an electric field with given field strength and/or characteristics and possibly adapted to the specific response of the material to the energy supplied by the field. The materials in the matrix will then be reconverted until the matrix in its entirety arrives in an electrical non-conducting state, something which will be the case if it e.g. is made of a material such as M(TCNQ). A multilayer structure or matrix of M(MTCNQ) material may thereafter be reconfigured with new electrical conducting and semiconducting structure, but this is not at present possible by using electrical fields. However, a method for generating as disclosed by the simultaneously filed International Patent Application PCT/NO99/00023 which belongs to the present applicant, may be used.

As the method for generating according to the present invention makes possible that suitable materials may be converted from an isolating to a semiconducting state or vice versa by electric fields, either directly or indirectly (e.g. in the last instance due to a simultaneous local heating), it will be possible to apply the method to manufacture for instance diodes and transistors which may be connected electrically with resistances and capacitors to form complete active electronic circuits. More specific examples of active components and circuits formed thereof shall be disclosed by the following examples.

EXAMPLE 1

FIG. 6 shows a forward-biased pn junction diode with conducting and semiconducting structures generated by the method according the invention and realised in thin-film technology with four sublayers SS1–SS4. The layers SS2 and SS3 contain the active semiconducting material provided between the electrodes 11 in respectively the sublayers SS1 and SS4. The active material 10 in the sublayer SS2 is an n-doped semiconductor, while the adjacent active material 10' in the sublayer SS3 is a p-doped semiconductor.

The electrodes 11 in the layers SS1 and SS4 are contacted by horizontal electrical conducting structures or conducting paths 9 in the same layer. The separate layer in the diode structure in FIG. 6 has typically a thickness of about 100 nm such that the whole structure forms a multilayer structure with a thickness less than 1 $\mu$m. The horizontal extension of the area of the diode structure will be determined by the spatial resolution which is realized with the use of an EFGM, but with the electrode means E1, E2 as shown in FIGS. 2a–f, it will be possible to form electrodes 21, 22 with pitches in the order of magnitude 0.2–1.0 $\mu$m by conventional lithographic methods or by using irradiation convertible materials and a method as disclosed in the above mentioned international patent application PCT/NO99/00023. Special printing methods or use of nanotechnological and chemical methods will besides be able to realize electrode structures which are one order of magnitude smaller. Realistically it may be supposed that with the available technologies for making the electrode devices it will be possible to modulate point and line potentials spatially in two dimensions to a smallest extension of 0.1 $\mu$m.

EXAMPLE 2—MOSFET

FIG. 7 shows schematically a MOSFET for use in the present invention and realized wholly in organic material in thin-film technology. The gate electrode 12 is provided in the sublayer SS1 and connected with a horizontal conducting structure 9, while the sublayer SS2 constitutes the gate isolator 13. The active semiconducting material 10 is provided in the sublayer SS3 and registers with the gate electrode 10. The source and drain electrodes 14 are provided in the following tap layer SS4 and are contacted by horizontal electrical conducting structures 9 in the same layer. Each of the layers comprises either electrical conducting structures or a semiconducting structure, as well as dielectric areas. The thickness of a MOSFET of this kind may be ½ $\mu$m, while the extension in the horizontal plane such as may be realized with present technology will be from at most a few $\mu$m to less than 1 $\mu$m, cf. what is said in example 1.

EXAMPLE 3—Logic CMOS Inverter

Figure 8:
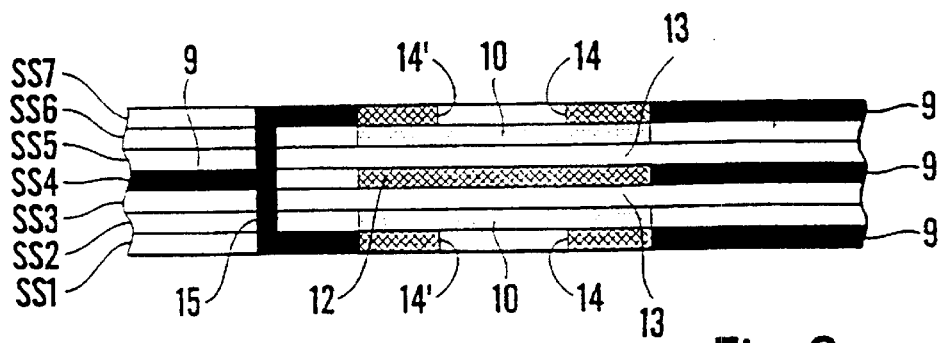

The MOSFET structure in FIG. 7 may now be used in logic gates, for instance a logic inverter in CMOS technology as shown in FIG. 8. An inverter of this kind is formed by parallel connection of the drain and source electrode in respectively an n-MOSFET and a p-MOSFET in a back-to-back configuration, with common gate electrode. For this purpose a vertical conducting structure 15 is generated and passes through all sublayers SS1–SS7 and connects the electrodes 14'. The output signal from the inverter is conveyed on this conducting structure 15 to a horizontal connecting structure 9 at left in the figure. The common gate electrode 12 of the MOSFET receive the input signal via the horizontal conducting structure 9 in the sublayer SS4 at right in the figure. The thickness of all sublayers will then be less than 1 $\mu$m, typically realized with about a thickness of about 0.7 $\mu$m, while the horizontal extension of the inverter will have the same dimensions as stated above in connection with the discussion of the MOSFET structure in the FIG. 7.

EXAMPLE 4—CMOS AND Gate

Active components like the MOSFET structures shown in FIG. 7 may be used for forming integrated circuits by stacking of sublayers with structures which have the desired electrical properties and wholly are realized in an organic thin-film technology. Specifically the following example is connected with an AND gate realized in CMOS technology with the use of the transistor structure as shown in FIG. 7. In order to facilitate the understanding of how active devices such as field-effect transistors may be combined in multi-layer structures into functional devices as for instance logic gates, reference shall be made to FIG. 9 which shows the circuit diagram for an AND gate realized in complementary MOS technology (CMOS technology). The CMOS AND gate is realized with respectively n-MOSFETS and p-MOSFETS of the enrichment type as switches. Two input signals A and B are conveyed respectively to the gate electrodes on p-MOS $Q_1$ and $Q_2$ and the gate electrodes on n-MOS $Q_3$ and $Q_4$. If both input signals switches A and B are high, the output signal $\overline{X}$ will be low. In this case $Q_3$ and $Q_4$ will both be on and the p-MOS switches $Q_1$ and $Q_2$ will both off, i.e. no current flows and the output signal $\overline{X}$ hence goes low. If, on the contrary, either the input signal A or the input signal B is low or both are low, correspondingly the p-MOS transistors $Q_1$ respectively $Q_2$ will be switched on and the output signal $\overline{X}$ goes high, as either one or both of the serially connected n-MOS $Q_3$, $Q_4$ are off and no current flows. The devices $Q_1$, $Q_2$, $Q_3$, $Q_4$ realize, as will be seen, a NAND gate and to realize an AND gate it is necessary to connect the output of the NAND gate with a logical inverter which also is realized in CMOS technology, respectively with the use of a p-MOS switch $Q_2$ and an n-MOS $Q_6$ switch connected in parallel. This is a standard CMOS inverter and if its input signal $\overline{X}$ is high, its output signal X will be the inverted of the input signal $\overline{X}$ and hence low. Conversely a low input signal $\overline{X}$ will be inverted to a high output signal X and this corresponds to the input signals A and B to the NAND gate both being high. In other words it is easily realized that circuit as shown in FIG. 9 realizes an AND gate and persons skilled in the art will understand that correspondingly logic OR and NOR gates may be realized and with ay number of inputs. However, in principle, all Boolean functions can be realized in combinations of one type of gate and one or more inverters realized in CMOS technology, for instance with the use of the transistor structure as shown in FIG. 7.

Purely practically the AND gate can be implemented in thin-film technology as shown in FIGS. 10a–10d and with the use of MOSFET structures corresponding to that shown in FIG. 7. FIGS. 10a–10d show the AND gate wholly realized in thin-film technology and with the active and passive devices provided in four sublayers SS1, SS3–SS5. The first sublayer SS1 (FIG. 10a) contains the gate electrodes $g_1$–$g_6$ where the subscript points to the corresponding subscript for the MOSFETs $Q_1$–$Q_6$ in FIG. 9. The inputs A and B are conveyed to respectively the gate electrodes $g_1$, $g_3$ and $g_2$, $g_4$ and via horizontal conducting structures or current paths 9. Correspondingly the gate electrodes $g_5$, $g_6$ in the inverter are connected with a horizontal current path 9. A vertical electrical conducting structure is denoted 15, the symbol $\Delta$ indicating that it extends upwards in vertical direction from the sublayers SS1. In FIG. 10b the symbols $\Delta$ and $\nabla$ indicate that the vertical conductor structure 15 in the layer SS3 extend vertically through this layer and on both sides thereof. The layer SS3 comprises areas with active semiconductor materials $b_1$–$b_6$ (corresponding to 10 in FIG. 7) which are assigned to and register with the corresponding gate electrodes $g_1$–$g_6$ in the layer SS1.—It is to be remarked that a layer SS2 exclusively, apart from the vertical conductor structure 15 which also extends through this sublayer on both sides thereof, consists of dielectric material which forms a common gate isolator for the MOSFETs $Q_1$–$Q_6$ which realize the AND gate. The layer SS2 is, of course, located between SS1 and SS3, but has been excluded from the drawing.—The layer SS4 FIG. 10c is provided above and adjacent to the layer SS3 and comprises respectively the source electrodes $s_1$–$s_6$ and the drain electrodes $d_1$–$d_6$ for the corresponding MOSFETs $Q_1$–$Q_6$. The active semiconductor material $d_1$–$d_6$ which is located in the layer SS3 is here indicated by stitched lines. The vertical current path 15 also extends also through the layer SS4 and to both sides thereof and contacts a horizontal current path 9 in the sublayer SS5 as shown in FIG. 10d. This horizontal current path corresponds to the connection between the drain electrodes $d_2$ and $d_3$ for the corresponding MOSFETs $Q_2$, $Q_3$ and is additionally also connected with the drain electrode $d_1$ on $Q_1$. Another horizontal current path 9 realizes the serial connection between the source electrode $s_3$ on $Q_3$ and the drain electrode $d_4$ on $Q_4$. The source electrodes $s_4$ and $s_6$ are grounded over further horizontal conductor structures 9, while the horizontal conducting structure 9 farthest to right in the layer SS5 is supplied with a voltage $V_{dd}$ and connects the source electrodes $s_1$, $s_2$, $s_5$ on respectively $Q_1$, $Q_2$ and $Q_5$. A further horizontal current path 9 uppermost in FIG. 10d forms the parallel connection between the drain electrodes $d_5$,$d_6$ on $Q_5$, $Q_6$ and the output line, denoted with X. The output signal $\overline{X}$ from the NAND gate consisting of $Q_1$, $Q_2$, $Q_3$, $Q_4$ is conveyed on the vertical current path 15. FIG. 11 shows schematically how the layers in FIG. 10 appear in stacked configuration, the layer SS2 with the gate isolator here being included. For the sake of clarity of stack, however, is shown exploded in its separate sublayers SS1–SS5, but with correct registration and the course of the vertical current path 15 through every sublayer is indicated by the stitched line. With the gate electrode layer SS1–SS5 provided on an underlying, not shown dielectric layer, the total AND structure as shown in FIG. 11 may have a thickness of 0.75 $\mu$m and an area of about 100 $\mu m^2$ (12.8 $\mu m^2$). The volume of the structure will hence be about 75 $\mu m^3$. With conservative spatial resolution this implies that about 10000 logic gates of this kind may be realized on an area of 1 mm$^2$ and with a thickness well below 1 $\mu$m. Correspondingly scaled the length of the current paths 9, 15 together becomes 60 $\mu$m.

EXAMPLE 5—AND Gate with Vertically Stacked CMOS Circuits

A reduction of the current path length and a significant simplification of the structure of the AND gate may be achieved by stacking the MOSFET structures vertically as shown in FIG. 12. Again the same reference numbers as in FIGS. 10 and 11 are used, and it will be seen that the vertical AND gate structure exploits the fact that the gate electrodes $g_1$ and $g_3$ of the transistors $Q_1$, $Q_3$ are at the same common potential, the gate electrodes $g_2$ and $g_4$ in $Q_2$, $Q_4$ on another common potential and the gate electrodes $g_5$ and $g_5$ in $Q_5$, $Q_6$ on a third common potential. Hence the transistors $Q_1$–$Q_6$ are implemented as CMOS circuits in a pairwise back-to-back configuration by common gate electrode $g_1$,$g_3$; $g_2$,$g_4$; $g_5$,$g_6$ for the corresponding MOSFET structures $Q_1$,$Q_3$, $Q_2$,$Q_4$; $Q_5$,$Q_6$. Each CMOS circuit is provided on an isolating layer which in FIG. 12 is located below $Q_3$, between $Q_1$ and $Q_4$ and between $Q_2$ and $Q_5$ in each of the MOSFET structures. The gate electrodes g are also, of course, isolated from the active semiconductor material b by not explicitly denoted isolating layers which comprise the respective gate isolators. The horizontal current paths in FIGS. 10 and 11 are now substantially replaced by vertical current paths which extend through the layers and provide the same connections as shown in the equivalent circuit in FIG. 9. Particularly the current path 15 is shown which also is realized vertically in the configuration in FIG. 10 and, as will be seen, as before connects the gate electrodes $g_5$,$g_6$ on $Q_5$, $Q_6$ with the connection between the drain electrodes $d_2$,$d_3$ on $Q_2$,$Q_3$ and the drain electrode $d_1$ on $Q_1$.

The vertical AND gate structure in FIG. 12 including the substrate 1 is generated by a total of 24 sublayers, of which 6 relatively thick isolating layers form the gate isolators and three corresponding thick isolating layers isolate the paired combinations of MOSFET structures mutually. With the same dimensions as indicated in connection with the description of FIG. 11 the whole stacked layer configuration in FIG. 12 hence will have a thickness of about 3.0 μm and be provided on an area of 16 μm². The total volume thus becomes less than 50 μm, may in the configuration in FIG. 12 well be about 15 μm in an optimal embodiment, which implies a reduction of about 70%. In this connection it shall particularly be taken in regard that FIG. 12 is schematic and that the vertical current paths are mutually is placed in the horizontal plane in order to appear more clearly. They may, however, lie in the same plane, parallel to one of the side surfaces of the structure.

Within the scope of today's thin-film technology and using technologies as mentioned above in order to create electrical conducting and semiconducting structures in thin films by irradiation of convertible organic materials, it is wholly possible to reduce the linear dimensions in the horizontal direction, such that the component density may be increased by at least one order of magnitude. This implies that the configuration in FIG. 11 may realize about $10^5$ logic gates of the kind shown in 1 mm² and with a layer thickness well below 1 μm, while the configuration in FIG. 12 might realize about $1-10^5$ gates on the same area with a somewhat better form factor, such that the increase in the device density becomes about 33% relative to the device density of the configuration of FIG. 11.

The processing of single layers, i.e. the generating of electrical conducting and semiconducting structures may after the converting by means of electric fields has taken place and when it is performed as shown in FIGS. 2a–f and FIG. 3, include possible post-treatments and corrections, e.g. a possible heat treatment before the separate layers are joined into a multilayer structure and form a stacked circuit configuration.

For instance a heat treatment of single layers after the conversion may be performed to control conducting or semiconducting properties, e.g. conversion of monomer to oligomer or polymer, doping, crystallization etc. Such processes are well-known and have a wide application and specific examples shall hence not be given here. The heat treatment may e.g. be performed by means of irradiation. Another possibility is to use the electric alternating fields. In principle alternating fields may also be used to effect the field conversion of EFCM and the power supply 23 shown in FIGS. 2a–f must then, of course, be an alternating voltage source. In that connection it shall be remarked that a resistive material which is subjected to an alternating field will be heated. By using an alternating voltage field for generating a transition from a non-conducting to for instance a conducting state a heating of the thus generated electrical conducting structure may take place and a possible desired heat treatment may also take place in situ and simultaneously with the conversion process.

By for instance using organic materials in the layers and generating the electrical conducting and semiconducting structures with conversion and by means of electric fields according to the present invention, it may be obtained a far simpler and cheaper manufacturing of electronic devices than which is possible with today's inorganic semiconductor technology. If a reel-to-reel arrangement is used in the manufacture of circuits as shown in FIG. 7, the production may take place with high volume and high speed and without essential dimensional limitations. With the joining of separate layers into a multilayer structure and forming of a stacked configuration, the registration between the layers will, however, be critical among other in order to ensure that vertical conducting structures in separate layers register mutually and that for instance electrodes and active semiconductor materials in semiconductor structures do the same. The requirement for registration accuracy will be given by the pitch which may be realized in the manufacture of the electrical conducting and semiconducting structures, but may practically also be realized by using interferometric methods for control and positioning, optically recordable marking, or mechanical or electrical nanotechnology. Such measures, however, fall outside the scope of the present invention and are hence not discussed in greater detail, but must be regarded as known to persons skilled in the art.

By using the method for generation according to the present invention the protocol for a given circuit configuration in multilayer design may be generated far from the manufacturing location of the circuit and transmitted thereto for downloading to for instance a control device which controls the generation of the physical circuit patterns in situ at the manufacturing location. A user may hence thereby generate and produce circuits by tele-processing according to own specifications solely by transmitting the necessary instructions and information. The present invention may thus furnish the concept application- and customer-specific circuit production with a radically new content.

What is claimed is:

1. A method for generating electrically conducting, semiconducting, and/or non-conducting structures in two or three dimensions in a composite matrix, the method comprising:

applying to each separate layer an electric field with given field strength and/or characteristics adapted to the specific response of a material to the energy supplied by the field, wherein the matrix comprises one or more materials respectively provided in one or more spatially separate and homogenous material structures, wherein the materials in response to the supply of energy can undergo specific physical and/or chemical changes of state which cause transition from an electrically non-conducting state to an electrically conducting and/or semiconducting state or vice versa, or a change in the electrically conduction mode of the material, and wherein each material structure is made in the form of a thin layer;

modulating in each case the fields spatially according to a determined protocol which represents a predetermined pattern of electrically conducting and/or semiconducting structures in the relevant material structure, whereby in the layers in response to the energy supplied by the field two-dimensional electrically conducting and/or semiconducting structures are generated with the pattern predetermined by the protocol; and optionally providing two or more layers in a stacked configuration, such that the composite matrix formed by laminating separate adjacent layers is provided with electrically conducting or semiconducting structures in three dimensions.

2. A method according to claim 1, characterized by modulating spatially the electric field in a plane substantially parallel with a layer by means of an electrode device with patterned electrodes, the electrode device by selective supply of voltage to the electrodes according to the determined protocol generating electrical point or line potentials, which generate the electrically conducting and/or semiconducting structures.

3. A method according to claim 1, characterized by the stacked configuration being formed by two or more layers after generating the electrically conducting and/or semiconducting structure in each layer being combined into laminated multilayer structures which forms the composite matrix with electrically conducting and/or semiconducting structures in three dimensions.

4. A method according to claim 3, characterized by forming the multilayer formed by a lamination of two or more self-supporting layers into a stacked configuration.

5. A method according to claim 4, characterized by positioning a layer after the lamination to adjacent layers such that two or more two-dimensional electrically conducting and/or semiconducting structures in the first-mentioned layer according to the protocol register with one or more two-dimensional electrically conducting and/or semiconducting structures in adjacent layers, whereby one or more vertical electrically conducting and/or semiconducting channels are generated in the cross-direction through the layers.

6. A method according to claim 5, characterized by providing an electrically conducting and/or semiconducting structure which forms a vertical channel through the layer according to the protocol, in electrically conducting and/or semiconducting connection with one or more two-dimensional electrically conducting or semiconducting structures in this layer.

7. A method according to claim 6, characterized by generating each channel with a conductivity or conduction mode which is constant between the layers.

8. A method according to claim 6, characterized by generating each channel with a conductivity or conduction mode which varies between the layers.

9. A method for erasing globally electrically conducting, semiconducting, and/or non-conducting structures in two or three dimensions in a composite matrix, the method comprising:

applying globally to the composite matrix an electric field with given field strength and/or characteristics adapted to the specific response of a material to the energy supplied by the field until the materials in the composite matrix in response to the energy supplied by the field in their entirety arrive in the electrically conducting or non-conducting state, wherein the matrix comprises one or more materials respectively provided in one or more spatially separate and homogenous materials structures, wherein the materials in response to the supply of energy can undergo specific physical and/or chemical changes of state which cause transition from an electrically non-conducting state to an electrically conducting and/or semiconducting state or vice versa, or a change in the electrically conduction mode of the material, and wherein each material structure is made in the form of a thin layer.

10. A method for generating electrically conducting, semiconducting, and/or non-conducting structures in two and/or three dimensions in a composite matrix comprising:

applying, separaely to each material layer, an electric field with given field strength and/or characteristics adapted to the specific response of the material to the energy supplied by the field, wherein each material layer is made in the form of a thin layer, and wherein each material layer in response to the electric field can undergo specific physical and/or chemical changes of state, wherein the changes of state comprise at least one of transitioning from an electrically non-conducting state to at least one of an electrically conducting and semiconducting state, transitioning from an electrical conducting state to at least one of an electrically non-conducting and semiconducting state, and changing the electrical conduction mode of the material;

modulating the electric field spatially according to a predetermined protocol which represents a predetermined pattern of electrically conducting, semiconducting, and/or non-conducting structures in the composite matrix, whereby in response to the energy supplied by the field two-dimensional electrically conducting, semiconducting, and/or non-conducting structures are generated with the pattern predetermined by the protocol; and combining two or more layers in a stacked configuration, such that the composite matrix formed by separate adjacent layers has electrically conducting, semiconducting, and/or non-conducting structures in three dimensions.

11. A method according to claim 10, wherein modulating spatially comprises:

modulating the electric field in a plane substantially parallel with the layer by means of an electrode device with patterned electrodes;

creating electrical point or line potentials by selective supply of voltage to the electrodes according to the determined protocol; and generating the electrically conducting, semiconducting, and/or on-conducting structures in response to the electrical point or line potentials.

12. A method according to claim 10, further comprising:

forming a stacked configuration by combining two or more layers into laminated multi-layer structures after generating the electrically conducting, semiconducting, and/or non-conducting structure in each layer, wherein the stacked configuration thereby forms the composite matrix with electrically conducting or semiconducting structures in three dimensions.

13. A method according to claim 12, wherein the stacked configuration is formed by a lamination of two or more self-supporting layers.

14. A method according to claim 13, further comprising:

forming one or more vertical electrically conducting, and/or semiconducting channels, by positioning a first layer such that two or more two-dimensional electrically conducting and/or semiconducting structures in the first layer in combination with one or more two-dimensional electrically conducting and/or semiconducting structures in adjacent layers form the one or more channels in a cross-direction through the layers.

15. A method according to claim 14, further comprising:

connecting one or more additional two-dimensional electrically conducting and/or semiconducting structures in the first layer with the electricity conducting and/or semiconducting structures that form the vertical channel through the layers.

16. A method according to claim 14, further comprising: generating each channel with a conductivity or conduction mode which is constant between the layers.

17. A method according to claim 14, further comprising: generating each channel with a conductivity or conduction mode which varies between the layers.

18. A method according to claim 10, further comprising: providing each separate material layer in tape form;

drawing from respective rolls each separate material layer tape;

tensioning and positioning of each material layer tape by alignment rolls; and laminating two or more material layer tapes in a stacked configuration, such that the composite matrix formed by separate adjacent layers is provided with electrically conducting, semiconducting, and/or non-conducting structures in three dimensions.

19. A method according to claim 10, wherein at least one material layer is an organometallic charge-transfer complex M (TCNQ) formed by TCNQ (7,7,8,8-tetracyanoquinodimetan, $C_{12}H_4N_4$).

20. A method according to claim 10, wherein a metal is used as an electron donor and wherein the metal is at least one of Li, Na, K, Ag, Cu and Fe.

* * * * *